United States Patent
Soo et al.

(10) Patent No.: US 6,323,125 B1
(45) Date of Patent: Nov. 27, 2001

(54) SIMPLIFIED DUAL DAMASCENE PROCESS UTILIZING PPMSO AS AN INSULATOR LAYER

(75) Inventors: Choi Pheng Soo, Johor; Wye Boon Loh, Johor Bahru, both of (MY); Lap Chan, San Francisco, CA (US)

(73) Assignees: Chartered Semiconductor Manufacturing Ltd; National University of Singapore; Nahyang Technological University of Singapore, all of Singapore (SG)

( * ) Notice: Subject to any disclaimer, the term of this patent is extended or adjusted under 35 U.S.C. 154(b) by 0 days.

(21) Appl. No.: 09/282,065

(22) Filed: Mar. 29, 1999

(51) Int. Cl.[7] .............................................. H01L 21/4763
(52) U.S. Cl. .......................... 438/645; 438/634; 438/631
(58) Field of Search .................................. 438/645, 634, 438/631, 700; 427/489

(56) References Cited

U.S. PATENT DOCUMENTS

| | | | |
|---|---|---|---|
| 5,041,361 | 8/1991 | Tsuo | 430/311 |
| 5,100,764 | 3/1992 | Paulson et al. | 430/311 |
| 5,487,967 | 1/1996 | Hutton et al. | 430/322 |
| 5,591,676 | 1/1997 | Hughes et al. | 437/195 |
| 5,635,423 | 6/1997 | Huang et al. | 437/195 |
| 5,689,140 | 11/1997 | Shoda | 257/774 |
| 5,705,849 | 1/1998 | Zheng et al. | 257/530 |
| 5,885,751 | * 3/1999 | Weidman et al. . | |
| 5,891,513 | * 4/1999 | Dubin et al. . | |
| 6,004,188 | * 12/1999 | Roy . | |
| 6,010,962 | * 1/2000 | Liu et al. . | |
| 6,071,809 | * 6/2000 | Zhao . | |
| 6,090,530 | * 7/2000 | Weidman et al. . | |
| 6,156,648 | * 12/2000 | Huang . | |
| 6,204,168 | * 3/2001 | Naik et al. . | |
| 6,242,805 | * 6/2001 | Weling . | |

OTHER PUBLICATIONS

T. Weidman, D. Sugiarto, M. Nault, D. Mui, Z. Osborne, C. Lee, and J. Yang, "CVD Photoresist Processes for Sub–0.18 Design Rules, " 1998 Symposium on VLSI Technology Digest of Technical Papers, 9–11 Jun. 1998, pp. 166–167.*

* cited by examiner

*Primary Examiner*—Charles Bowers
*Assistant Examiner*—Stephen W. Smoot
(74) *Attorney, Agent, or Firm*—George O. Saile; Rosemary L. S. Pike

(57) ABSTRACT

Only one photo mask defines the metal trench and via region. The mask blocks the UV light in the trench and via area forming Plasma Polymerized Methylsilane Oxide (PPMSO) in the exposed areas. Two step RIE plasma treatment using chlorine gas and oxygen gas removes the Plasma Polymerized Methylsilane (PPMS) in the trench and via regions. Conductive metal is deposited. A CMP process polishes back both excess metal along with the PPMSO, at a similar rate, to form: conducting metal lines, interconnects, and via contacts without metal dishing.

22 Claims, 4 Drawing Sheets

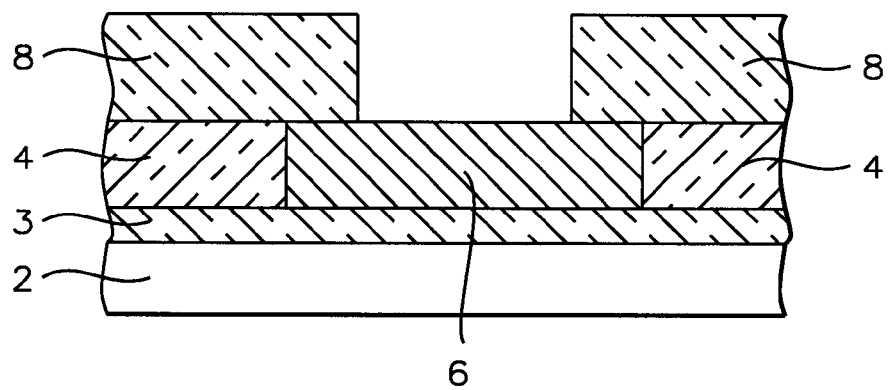
FIG. 1 – Prior Art
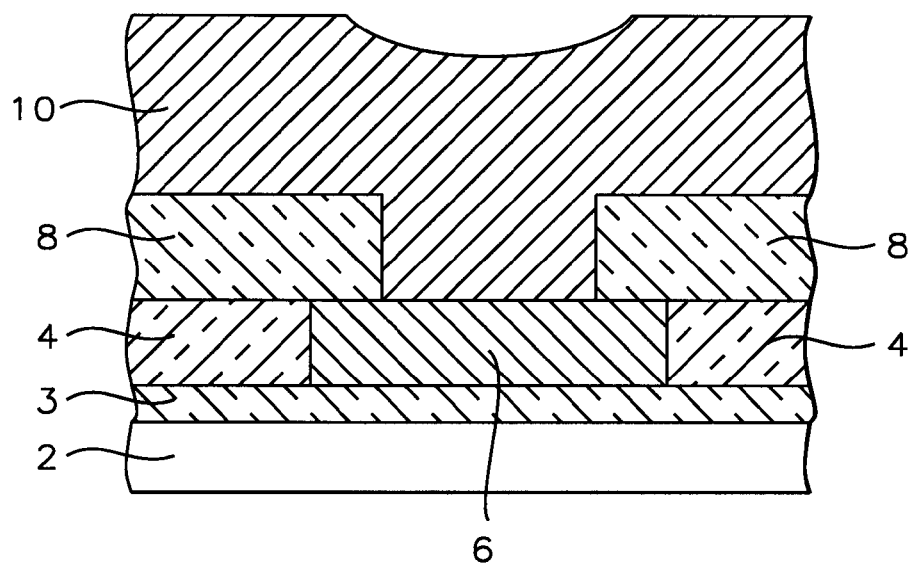
FIG. 2 – Prior Art
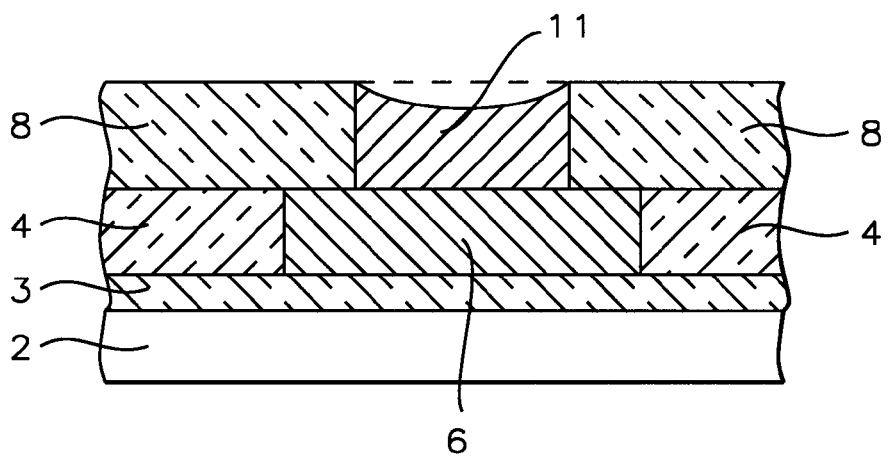
FIG. 3 – Prior Art

SIMPLIFIED DUAL DAMASCENE PROCESS UTILIZING PPMSO AS AN INSULATOR LAYER

BACKGROUND OF THE INVENTION (1) Field of the Invention

This invention relates to a method of fabrication used for semiconductor integrated circuit devices, and more specifically to a method whereby Plasma Polymerized Methylsilane (PPMS), a photosensitive polymer, forms an oxide layer, Plasma Polymerized Methylsilane Oxide (PPMSO), when exposed to UV light which forms the top insulating layer of a dual damascene insulating layer structure.

(2) Description of Prior Art

In the fabrication of semiconductor integrated circuits the dual damascene process is well known in the fabrication of multi-level conducting metal lines and interconnects.

Related patents teach various methods of photolithography processes to pattern metal lines both with and without dual damascene processing; but these methods do not cover the present invention which consists of using PPMS, a photosensitive polymer with dual damascene CMP processing.

U.S. Pat. No. 5,100,764 to Paulson et al teaches a method whereby sol gel, a colloidal suspension is used to form metal lines. A thin film of sol gel containing titanium, which is UV photo active, is exposed to UV activating the photo active compound which is then used to pattern the metal lines.

U.S. Pat. No. 5,487,967 to Hutton et al describes a photolithography process using a silylated resist that reacts with either exposed or unexposed regions of resist. The silylated resist is exposed to RIE and forms an "in situ" silicon dioxide etch mask, for precise image patterning from resist to substrate.

U.S. Pat. No. 5,591,676 to Hughes et al teaches a method of making a semiconductor device having a low permittivity dielectric. A fluorinated polymer layer is deposited on a metal, semiconductor or nonmetallic surface. The fluorinated polymer is heat treated and patterned by photolithography to form vias and then covered with a metal interconnect layer.

U.S. Pat. No. 5,689,140 to Shoda describes a method of forming studs and interconnects in multi-layered semiconductor devices. A dual damascene process is described with adhesion layers for each conductive layer.

U.S. Pat. No. 5,635,423 to Huang et al describes a dual damascene process to form multilevel metallization and inter-connect structures. An etch stop is described between the first and second insulating layers for via and trench patterning.

U.S. Pat. No. 5,705,849 to Zheng et al teaches a method for manufacturing an antifuse structure. A dual damascene process is described whereby structures comprising a pair of alternating layers of silicon nitride and amorphous silicon are sandwiched between two dual damascene connectors.

U.S. Pat. No. 5,041,361 to Tsuo describes an oxygen ion-beam lithographic patterning method using low-energy oxygen ion beams to oxidize amorphous silicon at selected regions. The non-oxidized regions are removed by etching in an RF excited hydrogen plasma.

SUMMARY OF THE INVENTION

It is a general object of the present invention to provide an improved method of forming integrated circuits in which a simplified dual damascene process uses CMP, chemical-mechanical polish to form planarized structures: metal line wiring, interconnects and via contacts, without the problem of dishing.

More specific to the invention is an improved method of forming planarized structures whereby Plasma Polymerized Methylsilane (PPMS), photosensitive polymer, forms an oxide layer, Plasma Polymerized Methylsilane Oxide (PPMSO), when exposed to UV illumination. The oxide layer PPMSO is patterned by a photomask to form the top layer of a dual damascene insulating layer structure. Conductive metal, copper, is deposited on to trench and via areas. CMP removes the excess metal and planarizes the surface since the PPMSO and copper can have similar CMP polishing rates. The process forms structures without dishing when PPMSO and copper are polished back at approximately the same rate.

Another object of the present invention is to provide planarized structures on semiconductor substrates to form: metal lines for wiring patterning, interconnects between multi-level metal layers, contacts through vias to metal lines and source/drain device contacts.

In accordance with the present invention, the above and other objectives are realized by using a method of fabricating a planarized structure on a semiconductor substrate, wherein a first insulating layer is provided. A second insulating layer over the first insulating layer is deposited. Patterning and etching of the second insulating layer follows to form an opening in the second insulating layer. A first layer of conducting metal is deposited on and into the second insulating layer. Then the excess conductive metal layer is polished back by CMP, chemical-mechanical polishing.

A third insulating layer is then deposited over the second insulating layer. Patterning and etching of the third insulating layer is performed to form openings on and over conducting metal lines, wiring pattern. Then, a layer of photosensitive polymer, Plasma Polymerized Methylsilane (PPMS) is deposited by Plasma Enhanced Chemical Vapor Deposition (PE CVD). PPMS is exposed to UV light using a photomask to form Plasma Polymerized Methylsilane Oxide (PPMSO); while blocking out the UV light in the trench and via openings. Unexposed PPMS is removed from the trench and via openings.

The said PPMS and PPMSO chemical formulas and reactions are outlined in the following section:

Methylsilane, Rf Plasma Deposition

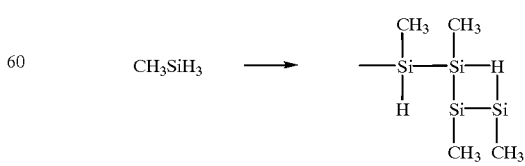

PPMS, Plasma Polymerized Methylsilane

PPMS, Ultaviolet Exposure in Air

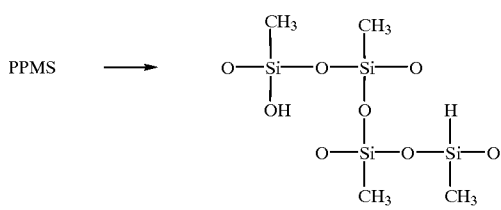

PPMSO, Plasma Polymerized Methylsilane Oxide

Next, a conductive barrier layer is conformally deposited and it provides a lining for the trench and via regions. This layer acts as diffusion barrier and CMP etch stop. A conductive metal layer is deposited and the excess metal is planarized by CMP without dishing when the CMP polishing rate of the conductive metal and the PPMSO, Plasma Polymerized Methylsilane Oxide, are similar.

In a second embodiment of the present invention, the above and other objectives are realized by using a simplified dual damascene technique to form a conductive contact to a semiconductor doped region, interconnection wiring pattern, via and conducting metal line, in the fabrication of an MOSFET device. Therefore, providing said active elements in said semiconductor substrate. A semiconductor substrate is provided with a first insulating layer, PE CVD TEOS (tetra-ethyl-ortho-silicate) deposited silicon oxide thereon. Patterning and etching of the silicon oxide is performed to form via holes for interconnects. At this point in the process, a layer of PPMS, photosensitive polymer is deposited by Plasma Enhanced CVD method, PE CVD. PPMS is exposed to UV light to form PPMSO, while a photomask blocks out the trench and via opening regions. The unexposed PPMS is removed from the trench and via openings. A barrier conducting layer, TaN (tantalum nitride), is deposited and lines both the trench and via. This layer of TaN acts as diffusion barrier and CMP etch stop. A thick conductive layer of Cu (Copper) is deposited and the excess metal is planarized by CMP without dishing. Key to this process is that the PMMSO and Cu CMP back at similar polishing rates.

BRIEF DESCRIPTION OF THE DRAWINGS

The object and other advantages of this invention are best described in the description of the preferred embodiments with reference to the attached drawings that include:

FIGS. 1–3, which in cross-sectional representation illustrate the prior art method, showing dishing of the metal after CMP back.

DESCRIPTION OF THE PREFERRED EMBODIMENTS

Figure 4:
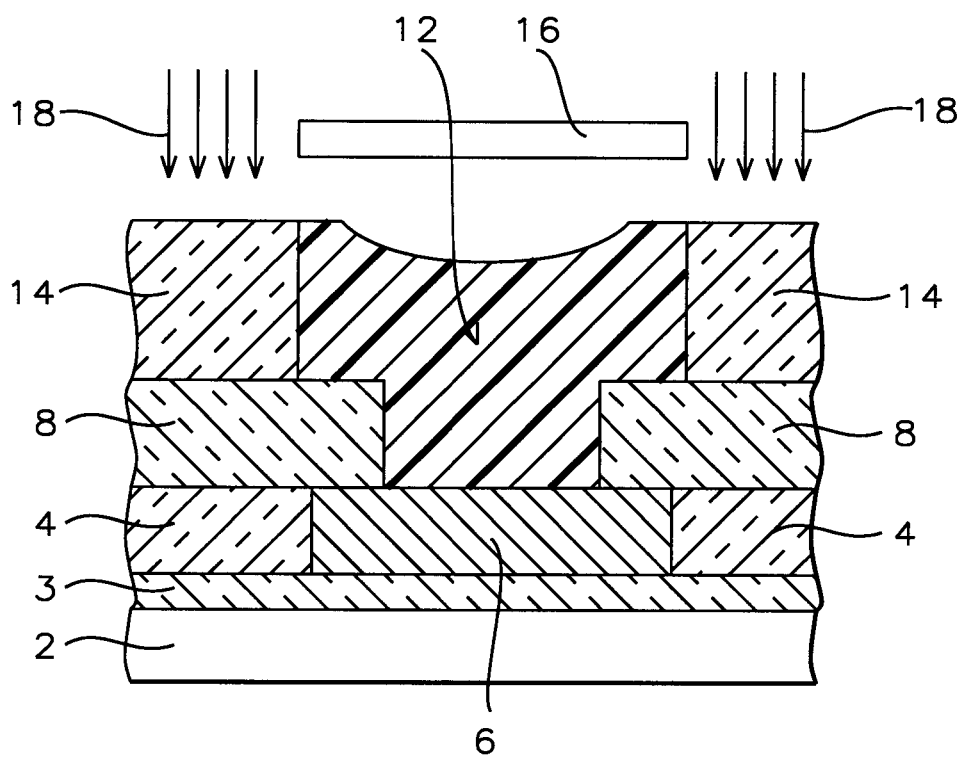
FIGS. 4–7, which in cross-sectional representation illustrate the method of the present invention.

Prior art is illustrated in cross-sectional drawings in FIGS. 1, 2 and 3. As shown in FIG. 1, a semiconductor substrate 2 is provided with an insulating layer 3. Two layers of dielectric 4 and 8 are patterned with trench and via opening. A metal conducting line 6 is patterned and provided with said structure. In FIG. 2 conductive metal 10 is deposited over the structure. The excess metal is polished back by CMP and the resulting dishing structure 11 is shown in FIG. 3.

In the present invention a simplified dual damascene process is described whereby conductive metal lines, interconnects, contact vias to metal lines and doped regions are formed without the problem of dishing, in the fabrication of MOSFET devices. As shown in FIG. 4, a semiconductor substrate 2 is provided with a first insulating layer 3 and a second insulating layer 4 is deposited, which is PE CVD TEOS deposited silicon oxide. Patterning and etching of the silicon oxide 4 is performed to form via holes for interconnects. A layer of copper 6, first conductive metal, is deposited on the silicon oxide 3, first insulating layer. The excess metal is removed by CMP. A third insulating layer 8 is deposited by PE CVD TEOS over the second insulating layer 4. Then patterning and etching of this third insulating layer 8, silicon oxide, is performed to form trench and via openings.

At this point in the process, a layer of Plasma Polymerized Methylsilane (PPMS), photosensitive polymer 12 is deposited by plasma enhanced CVD, in a thickness range from approximately 4,000 to 10,000 Angstroms. PPMS is exposed to UV light 18, wavelengths of 248 nm or 193 nm, to form Plasma Polymerized Methylsilane Oxide (PPMSO) 14; while a photomask 16 blocks out the trench and via opening regions 12. The aforementioned chemical formulas and reactions are outlined below:

Methylsilane, Rf Plasma Deposition

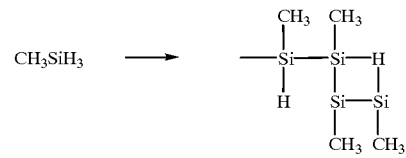

PPMS, Plasma Polymerized Methylsilane
PPMS, Ultraviolet Exposure in Air

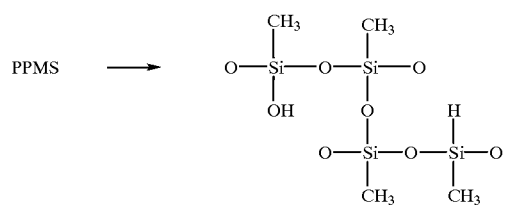

PPMSO, Plasma Polymerized Methylsilane Oxide

Figure 5:
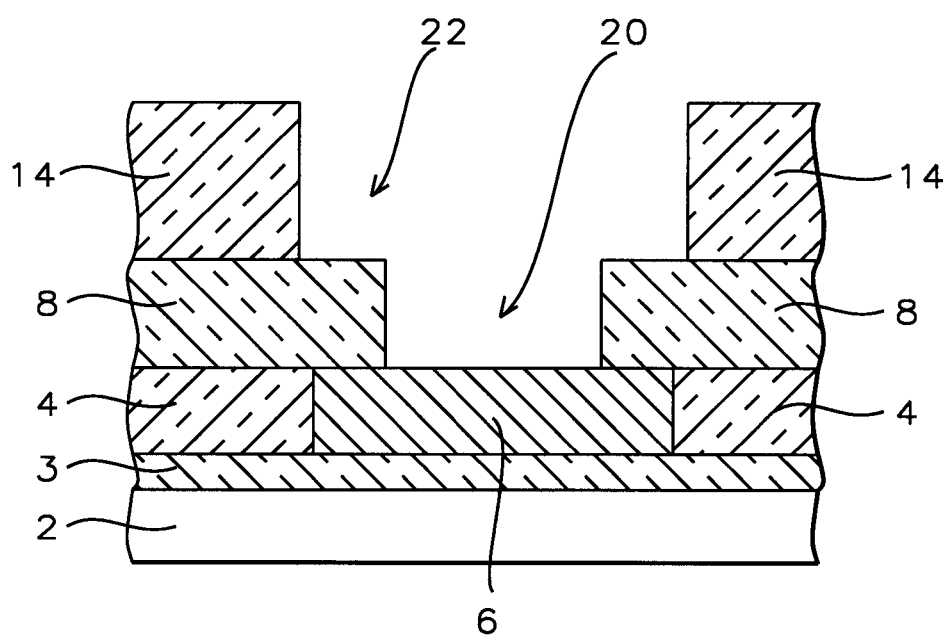

The unexposed PPMS 12 is removed from the trench 22 and via 20 openings, as shown in FIG. 5, by the following processes, either by Reactive Ion Etch (RIE) or by High Density Plasma (HDP) etcher. Typical process conditions for the selective removal of unreacted PPMS without significantly attacking the underlying copper layer 6 are:

Chlorine gas flow of approximately 50 to 200 SCCM, power of approximately 200 to 1000 watts, chamber pressure of approximately 1 to 100 milli-Torr.

Figure 6:
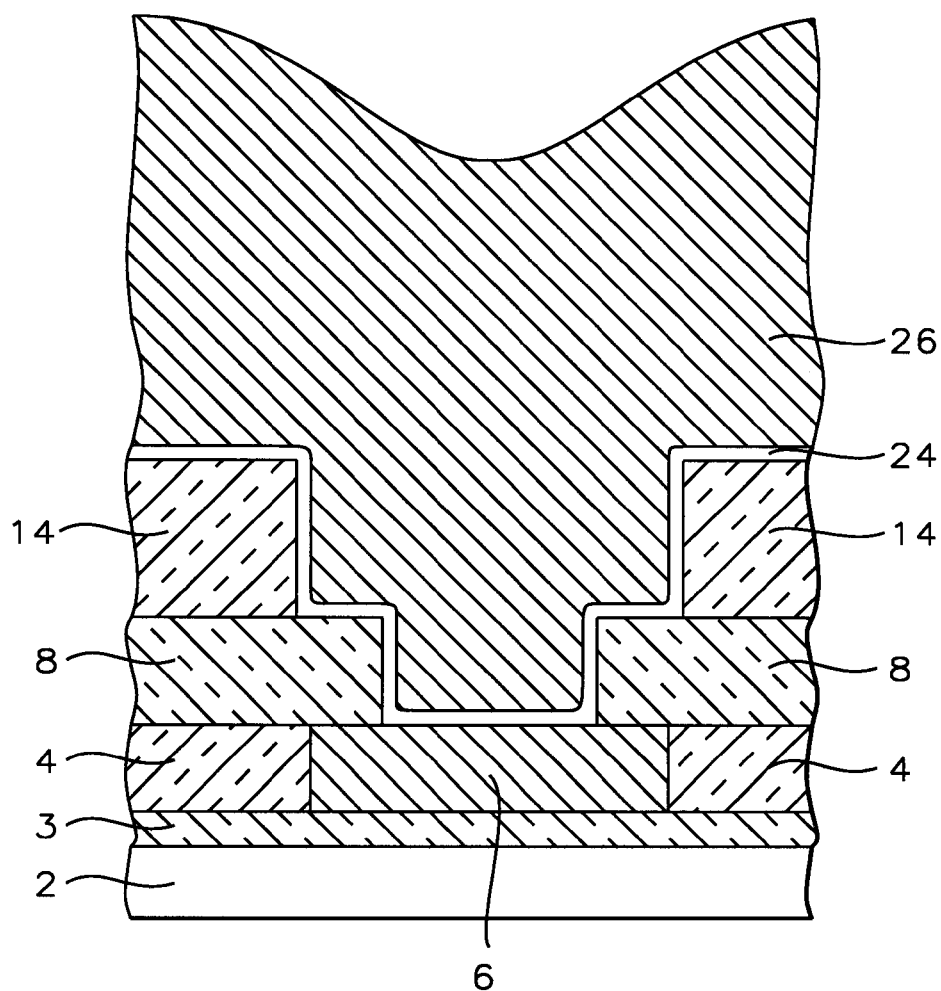
Figure 7:
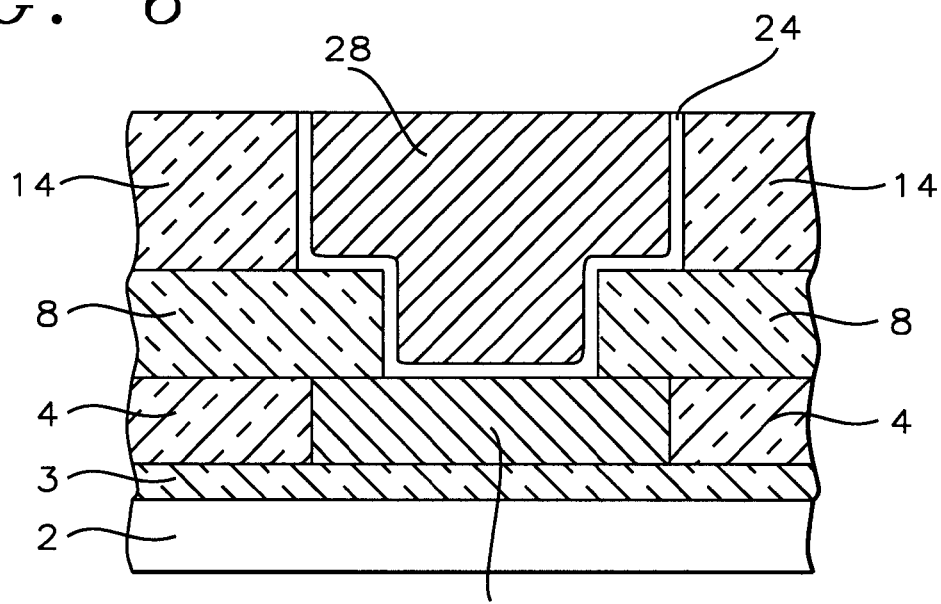

As shown in FIG. 6, a barrier conducting layer 24 of TaN is deposited and forms a liner for both the trench and via. A thick conducting layer 26 of Cu is deposited and the excess metal is planarized 28 by CMP without dishing, as shown in FIG. 7. Key to this process is that both the PPMSO 14 and the Cu 28 chemical-mechanical polish (CMP) back at a similar polishing rate, in the range of approximately 1,000 to 4,000 Angstroms per minute.

Figure 8:
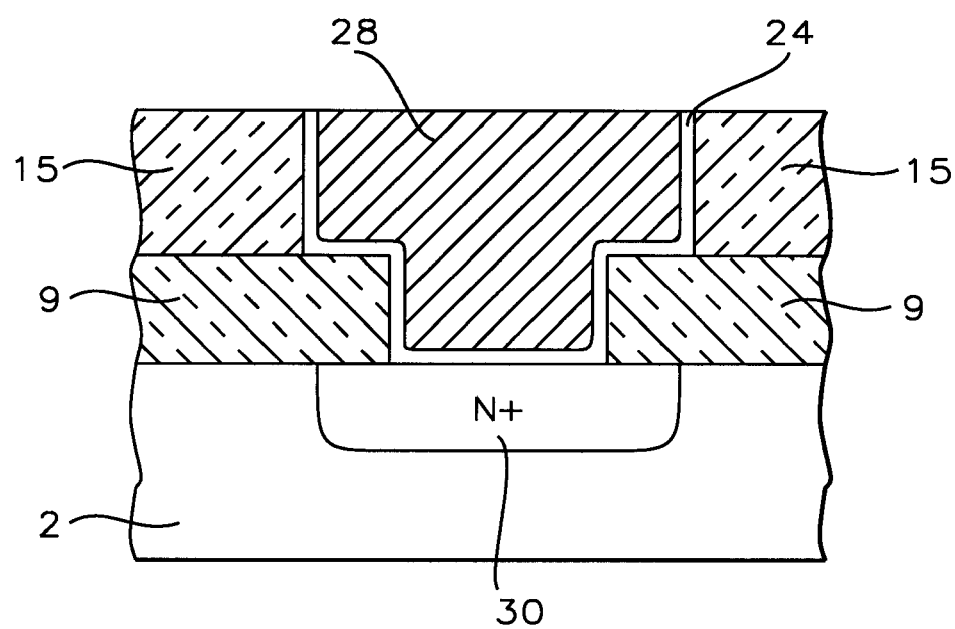
FIG. 8, which in cross-sectional representation illustrates another embodiment of the present invention where the application is contact through a via to a source/drain of an MOSFET device.

In another embodiment of the present invention, electrical contact through a via is made to a source/drain doped region 30, as shown in FIG. 8. A similar process as described above takes place. FIG. 8 sketches a simplified variation and application of the present invention. An insulating layer 9 is deposited by PE CVD TEOS over the substrate 2. Then patterning and etching of this insulating layer, silicon oxide, is performed to form a via openings. At this point in the process, a layer of PPMS, photosensitive polymer is deposited by Plasma Enhanced CVD (PE CVD). PPMS is exposed to UV light to form PPMSO 15, while a photomask blocks out the trench and via opening regions. The unexposed PPMS is removed from the trench and via openings. A barrier conducting layer, TaN 24, is deposited and lines both the trench and via. This layer of TaN acts as diffusion barrier and CMP etch stop. A thick conductive layer of Cu is deposited and the excess metal 28 is planarized by CMP without dishing. Key to this process is that both the PMMSO and Cu CMP back at similar polishing rates.

As shown in FIG. 8, a barrier conducting layer 24, TaN, is deposited and lines both the trench and via. This layer of TaN acts as diffusion barrier and CMP etch stop. A thick conductive layer 28 of Cu is deposited and the excess metal 28 is planarized by CMP without dishing, as shown in the figure. Key to this process is that the PMMSO 15 and Cu 28, both CMP back at similar polishing rates.

While the invention has been particularly shown and described with reference to the preferred embodiments thereof, it will be understood by those skilled in the art that various changes in form and details may be made without departing from the spirit and scope of the invention.

What is claimed is:

1. A method of using a dual damascene technique to form a conductive contact to a semiconductor device comprising:
   providing a substrate having a first insulating layer thereon;
   depositing a second insulating layer over said first insulating layer;
   patterning and etching of said second insulating layer to form via opening through said second insulating layer;
   depositing a first conductive metal layer into second insulating layer;
   removing the excess first conductive metal layer by CMP;
   depositing a third insulating layer over said second insulating layer patterning and etching said third insulating layer to form trench openings;
   depositing a layer of Plasma Polymerized Methylsilane (PPMS), a photosensitive polymer;
   exposing PPMS to UV light to form Plasma Polymerized Methylsilane Oxide (PPMSO), while blocking out the UV light in the trench and via openings;
   removing unexposed PPMS from the trench and via opening;
   depositing a barrier conducting layer which lines trench and via region and whereby said layer acts as a diffusion barrier and a CMP etch stop;
   depositing a second conductive metal layer to fill the remaining trench and via region and planarizing the excess second metal conductive layer by CMP without metal dishing.

2. The method of claim 1, wherein said first insulating layer is an interlevel dieletric and is PE CVD TEOS deposited, plasma enhanced chemical vapor deposition, to form said first insulating oxide layer and is a silicon oxide layer between about 4,000 to 8,000 Angstroms in thickness.

3. The method of claim 1, wherein the second layer of insulator is conformal CVD deposited silicon oxide and has a thickness range between about 4,000 to 8,000 Angstroms.

4. The method of claim 1, wherein the second layer of insulator is patterned with a line width or space of less than about 250 nm.

5. The method of claim 1, wherein the first conductive metal is copper, deposited in a thickness range from about 4,000 to 10,000 Angstroms.

6. The method of claim 1, wherein the third layer of insulating material is conformal CVD deposited silicon oxide and has a thickness between about 4,000 to 8,000 Angstroms.

7. The method of claim 1, wherein the third layer of insulating material is patterned with dimensions, width ranges from about 2,000 to 6,000 Angstroms, and height ranges from about 4,000 to 8,000 Angstroms.

8. The method of claim 1, wherein said layer of PPMS, photosensitive polymer is plasma enhanced CVD deposited under the following conditions: chamber pressures from about 200 mTorr to 10 Torr, thickness range from about 4,000 to 10,000 Angstroms, methylsilane flow rate between approximately 50 to 200 sccm, and Rf power between about 400 to 1,000 Watts.

9. The method of claim 1, wherein said exposing PPMS to UV light step, uses a UV mask and lithography exposure range to pattern sub 250 nm line width and sub 250 nm line space.

10. The method of claim 1, wherein said unexposed PPMS is removed by RIE or High Density Plasma etcher with chlorine gas flows between about 50 to 200 sccm, pressure range between about 1 to 100 mTorr, power between 200 to 1,000 Watts, and selective etch chemistry to remove PPMS.

11. The method of claim 1, wherein said trench and via liner, barrier and CMP etch stop is TaN in thickness ranging from about 50 to 500 Angstroms with preferred deposition conditions being by Ionized Metal Plasma (IMP) sputtering or by Chemical Vapor Deposition (CVD).

12. The method of claim 1 wherein the second conductive metal for trench and via fill is copper in thickness ranging from about 4,000 to 10,000 Angstroms.

13. A method of using a dual damascene technique to form a conductive contact to a semiconductor doped region or to an interconnection wiring pattern, in the fabrication of an MOSET device comprising:
   providing active device elements in a semiconductor substrate;
   providing said semiconductor substrate with having a first insulating layer, PE CVD TEOS deposited, silicon oxide thereon;
   providing patterning and etching of the first insulating layer, silicon oxide, to form via holes for interconnects;
   depositing by Plasma Enhanced CVD a layer of PPMS, Plasma Polymerized Methylsilane, photosensitive polymer;
   exposing PPMS to UV light to form PPMSO, Plasma Polymerized Methylsilane Oxide, a second insulating layer while blocking out the UV light to define trench openings;
   removing unexposed PPMS from the trench and underlying via openings;
   depositing a barrier conducting layer, TaN, that lines both trench and via, for a diffusion barrier and CMP etch stop;
   depositing a thick conductive metal layer, Cu, to fill the remaining trench and via openings and
   planarizing any excess metal by CMP without dishing.

14. The method of claim 13, wherein said semiconductor substrate is a single crystal of semiconducting silicon.

15. The method of claim 13, wherein said contact is made to a source/drain diffusion area of an MOSFET device on a semiconductor substrate.

16. The method of claim 13, wherein said contact is made to a metal line in a multi-level wiring pattern connecting semiconductor devices.

17. The method of claim 13, wherein said first insulating layer is an interlevel dielectric and is PE CVD TEOS deposited, plasma enhanced chemical vapor deposition, to form said first insulating oxide layer and is a silicon oxide layer between about 4,000 to 8,000 Angstroms in thickness.

18. The method of claim 13, wherein said layer of PPMS, photosensitive polymer is Plasma Enhanced CVD deposited under the following conditions:

chamber pressures from about 200 mTorr to 10 Torr, thickness range from about 4,000 to 10,000 Angstroms, methylsilane flow rate between approximately 50 to 200 sccm, and Rf power between about 400 to 1,000 Watts.

19. The method of claim 1, wherein said exposing PPMS to UV light step, uses a UV mask and lithography exposure range to pattern sub 250 nm line width and sub 250 nm line space.

20. The method of claim 13, wherein said unexposed PPMS is removed by RIE or High Density Plasma etcher with chlorine gas flows between about 50 to 200 sccm, pressure range between about 1 to 100 mTorr, power between 200 to 1,000 Watts, and selective etch chemistry to remove PPMS.

21. The method of claim 13, wherein said trench and via liner, barrier and CMP etch stop is TaN in thickness ranging from about 50 to 500 Angstroms with preferred deposition conditions being by Ionized Metal Plasma (IMP) sputtering or Chemical Vapor Deposition (CVD).

22. The method of claim 13, wherein the conductive metal for trench and via fill is copper in thickness ranging from about 4,000 to 10,000 Angstroms.

* * * * *